(12) United States Patent
Moroz et al.

(10) Patent No.: US 7,996,795 B2
(45) Date of Patent: Aug. 9, 2011

(54) METHOD AND APPARATUS FOR PERFORMING STRESS MODELING OF INTEGRATED CIRCUIT MATERIAL UNDERGOING MATERIAL CONVERSION

(75) Inventors: Victor Moroz, Saratoga, CA (US); Xiaopeng Xu, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 274 days.

(21) Appl. No.: 12/429,900

(22) Filed: Apr. 24, 2009

(65) Prior Publication Data

US 2010/0274376 A1    Oct. 28, 2010

(51) Int. Cl.
*G06F 17/50* (2006.01)
(52) U.S. Cl. ............... 716/56; 716/53; 716/54; 716/55
(58) Field of Classification Search .............. 716/53–56, 716/106, 119; 700/97, 98, 121
See application file for complete search history.

(56) References Cited

OTHER PUBLICATIONS

B.E. Deal et al. "General Relationship for the Thermal Oxidation of Silicon" Journal of Applied Physics, vol. 36, No. 12, Dec. 1965, pp. 3770-3778.

Victor Moroz et al. "Modeling the Impact of Stress on Silicon Processes and Devices" Materials Science in Semiconductor Processing 6 (2003), pp. 27-36.

*Primary Examiner* — Vuthe Siek
*Assistant Examiner* — Brian Ngo
(74) *Attorney, Agent, or Firm* — Kenta Suzue; Haynes Beffel & Wolfeld LLP

(57) ABSTRACT

A method, a computer medium storing computer instructions performing a method, and a computer with processor and memory perform stress modeling as follows. The stress model transforms a representation of a material conversion of a first material in the integrated circuit to a second material in the integrated circuit. Prior to the material conversion the first material occupies a first space having a first boundary. After the material conversion the first material and the second material together occupy a second space having a second boundary. The first space and the second space are different. The stress model performed by the computer system transforms the representation of the material conversion of the first material to the second material into: i) the first material occupying the first space having the first boundary, and ii) a strain displacement condition of the first material. The strain displacement condition is determined by a spatial change from the first boundary to the second boundary.

22 Claims, 11 Drawing Sheets

METHOD AND APPARATUS FOR PERFORMING STRESS MODELING OF INTEGRATED CIRCUIT MATERIAL UNDERGOING MATERIAL CONVERSION

BACKGROUND

1. Field

The present technology relates to methods and systems for improving the stress modeling of integrated circuits through improved modeling of material conversions such as oxidation, silicidation, and amorphization and epitaxial recrystallization of semiconductors.

2. Description of Related Art

Methods have been developed to model the impact of stress on the behavior of integrated circuit devices at the level of individual transistors. These methods include, for example, full-scale analysis with a Technology Computer Aided Design (TCAD) system; and a method described in U.S. patent application Ser. No. 11/291,294, filed Dec. 1, 2005, incorporated herein by reference.

Behaviors characterized by the various methods for analyzing stress impact at the level of individual transistors can be used to derive circuit level parameters (e.g. SPICE parameters) of the device for subsequent analysis of the circuit consisting of multiple transistors. Such analysis can help predict whether the circuit will operate as intended, and with what margins, or whether the design or manufacturing process or layout need to be revised. For transistors affected by stress caused by shallow trench isolation (STI) regions in proximity to transistor channel regions, revisions can often be made by applying certain general rules-of-thumb, such as increasing the size of any transistor that, according to the stress analysis, turns out to be weaker than expected. Other techniques can also be used to either to relax known undesirable stress, or to introduce known desirable stress, or merely to improve uniformity throughout the layout. See U.S. Patent Publication No. 2007-0202663, incorporated herein by reference.

As integrated circuit scaling shrinks the transistors and the spacing between them, three-dimensional (3D) stress modeling becomes necessary to accurately estimate stress distribution in the transistors and in between the transistors.

Prior stress modeling tools operating in 2D rather than 3D have been able to perform stress modeling with a rigorous model that moves the boundaries of the material(s) undergoing a material conversion. For example, in oxidation, a semiconductor bulk, e.g. silicon, reacts with a dissolved oxidant at the semiconductor-oxide interface, consuming and converting semiconductor bulk material into oxide bulk material. To reflect this consumption and conversion, the boundary between the semiconductor bulk material and the oxide bulk material is moved. The stress model is then applied to the semiconductor bulk material and the oxide bulk material according to this new boundary.

However, transitioning of this rigorous model from 2D to 3D has been unreliable; the 3D stress modeling breaks in the face of the much more demanding problems in 3D. In 2D stress modeling, the different materials occupy 2D spaces, and the boundaries between different materials are lines (requiring 2D description to locate them among the spaces occupied by the different materials). But in 3D stress modeling, the different materials occupy 3D volumes, and the boundaries between different materials are surfaces (requiring 3D description to locate them among the volumes occupied by the different materials). So 3D stress modeling has been unreliable because of the significantly more demanding problems of modeling different materials occupying 3D volumes rather than 2D areas, and the surface boundaries between different materials rather than line boundaries. Also, 3D stress modeling has been unreliable because these 3D volumes occupied by different materials and the surface boundaries between different materials, must change in time to accurately model the ongoing material conversion in time. Accordingly, at present 3D stress modeling fails to rigorously model conversion between different materials.

Historically, 2D modeling has successfully modeled the movement of boundaries between different materials participating in a material conversion. Accordingly, those of skill in the art continue to apply the rigor of modeling this boundary movement, which has been successfully applied in 2D stress modeling, to ongoing attempts to perform 3D stress modeling.

SUMMARY

Modeling tools perform stress modeling in a rigorous model that moves the boundaries of the material(s) undergoing a material conversion. Examples of material conversions are oxidation, silicidation, and amorphization and epitaxial recrystallization of semiconductors. To model oxidation, an oxidant species at the oxide-ambient interface diffuses, e.g. through already formed oxide, according to the diffusion equation. The semiconductor bulk, e.g. silicon, reacts with the dissolved oxidant at the semiconductor-oxide interface, consuming and converting semiconductor bulk material into oxide bulk material. The consumption and conversion of semiconductor bulk into oxide is determined. Because the grown oxide requires more space than the consumed semiconductor, the entire structure is deformed.

Various embodiments describe the modeling of material conversion. The pre-conversion material occupies a first space having a first boundary. The post-conversion material occupies a second space having a second boundary. The first and second spaces are different, because the first and second materials occupy different volumes. The material conversion is transformed as follows.

Prior to the transformation, the model represents a physical semiconductor undergoing a material conversion of a first material in the integrated circuit to a second material in the integrated circuit. Prior to the material conversion, the first material occupies a first space having a first boundary. After the material conversion the first material and the second material together occupy a second space having a second boundary.

After the transformation, the model represents the material conversion of the first material to the second material differently. After the transformation, the material conversion is represented by: i) the first material occupying the first space, such that the first space has the first boundary, and ii) a strain displacement condition of the first material, such that the strain displacement condition is determined by a spatial change from the first boundary to the second boundary, where the spatial change corresponds to the pre-transformation spatial change between the first boundary and the second boundary.

The following lists various examples of material conversions from the first material to the second material, and the corresponding identities of the first material and the second material.

In one embodiment, the first material is silicon, the second material is silicon oxide, and the material conversion of the material is growth of silicon oxide on the silicon.

In one embodiment, the first material is semiconductor, the second material is oxide, and the material conversion of the material is growth of the oxide on the semiconductor.

In one embodiment, the first material is silicon oxide on silicon, the second material is additional silicon oxide, and the material conversion of the material is growth of the additional silicon oxide on the silicon oxide on the silicon.

In one embodiment, the first material is oxide on semiconductor, the second material is additional oxide, and the material conversion of the material is growth of the additional oxide on the oxide on the semiconductor.

In one embodiment, the first material is crystalline semiconductor, the second material is semiconductor amorphized by ion implantation, and the material conversion of the material is epitaxial recrystallization of the amorphized semiconductor.

Silicidation is similar to oxidation, except that metal atoms react with silicon instead of the oxygen. For example, to form nickel silicide a film of nickel is deposited on top of silicon. When heated up, the nickel atoms react with silicon atoms to form one of the nickel silicide phases: NiSi or $Ni_2Si$ or $NiSi_2$ depending on the processing conditions. The volume of NiSi is much larger than the sum of the volumes of the original Ni and the consumed silicon; therefore there is a layer-growth-induced stress. Besides nickel, which is the most popular at this point, the industry has been using tungsten or cobalt or platinum to form silicides. If applied to germanium instead of silicon, the result is germanide instead of silicide.

The following lists various examples of the boundary condition.

In one embodiment, the strain displacement condition is at the first boundary of the first space.

In one embodiment, the strain displacement condition is determined by the spatial change from the first boundary to the second boundary, in that the strain displacement condition is determined by distance from the first boundary to the second boundary. In another embodiment, the distance from the first boundary to the second boundary, is in a direction perpendicular to a location of the boundary of the first space.

In one embodiment, the strain displacement condition is determined by the spatial change from the first boundary to the second boundary, in that the strain displacement condition along the first boundary is determined along the first boundary by distances from locations along the first boundary to the second boundary. In another embodiment, the distance from the first boundary to the second boundary, is in a direction perpendicular to a location of the boundary of the first space.

There are two fundamental parts of the layer growth (or material conversion). First, there is a consumption of the involved original materials. For example, some silicon material is consumed to form the silicon dioxide. The oxygen consumption does not really matter here, because the oxygen is coming from an ambient rather than a solid. The consumption does not create any stress. The second part is the volumetric change, because usually the density and volume of the resulting material are different from the density and volume of the original materials being converted into the resulting material. The volume conversion can be either shrinkage if the resulting material is denser than the original or volume expansion if the resulting material is less dense than the original. Any volume change like the shrinkage or the volume expansion create stress. For thermal oxidation and silicidation, there is volume expansion, leading to compressive stress in the adjacent silicon. For epitaxial recrystallization of the amorphized silicon, there is volume shrinkage, leading to tensile stress in the recrystallized silicon. The displacement boundary condition that is applied for stress modeling (regardless of whether we move or don't move the material boundaries) is always coming from the volume conversion at the interface of silicon and the new material (which would be oxide, silicide, and silicon for oxidation, silicidation, and epitaxial recrystallization, respectively).

The following lists various additional practical applications of the stress modeling technology, in addition to the practical application of the stress modeling's transformation by itself.

The impact is considered of oxidation induced stress around STI, which is known to create defects in the surrounding silicon crystal. The defects typically increase leakage currents that can either degrade or completely distort functionality of the integrated circuit. Therefore, it is important to be able to accurately estimate oxidation induced stress to avoid defect formation. To have accurate stress estimates, stress modeling is performed in 3D, which is where the proposed approach is useful.

In one embodiment, subsequent to improved stress modeling, the computer system estimates leakage currents from defects created by oxidation induced stress around shallow trench isolation oxide.

The impact of layer-growth-induced stress on the electrical performance of the adjacent transistors is considered.

In one embodiment, subsequent to improved stress modeling, the computer system transforms the circuit design of the integrated circuit into a definition of a lithographic mask to manufacture the integrated circuit including said performing the stress model.

In another embodiment, subsequent to improved stress modeling, the computer system simulates electrical performance of devices in the integrated circuit such that the electrical performances of the devices simulated by the computer system vary with the stress model transforming the representation of the material conversion.

In another embodiment, subsequent to improved stress modeling, the computer system simulates manufacturing yields of devices in the integrated circuit such that the manufacturing yield of the devices simulated by the computer system vary with the stress model transforming the representation of the material conversion In one embodiment, the stress model is three-dimensional. In another embodiment, the stress model is two-dimensional. Although the two-dimensional stress model is significantly less accurate than the three-dimensional stress model, FIG. 1 shows a transistor with undergoing a material conversion in the form of semiconductor oxidation.

DETAILED DESCRIPTION

Figure 1:
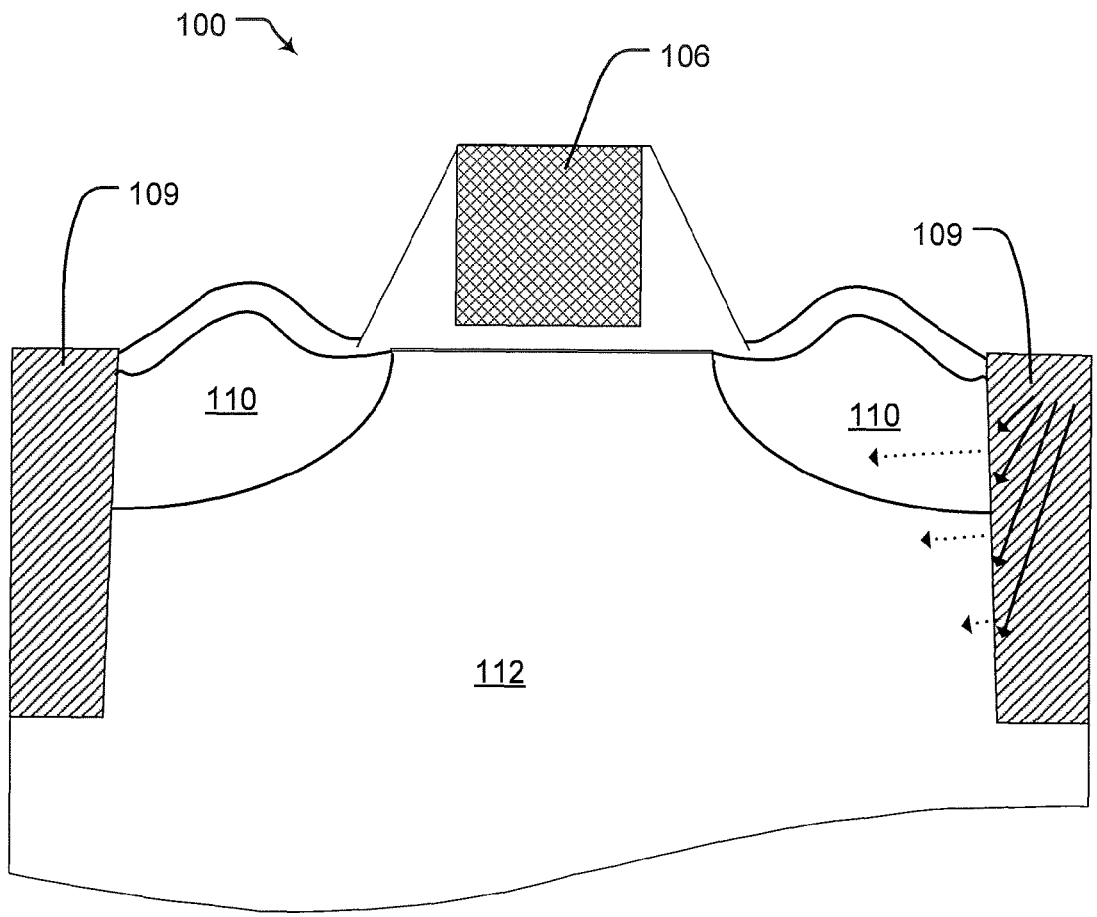
FIG. 1 shows a transistor with undergoing a material conversion in the form of semiconductor oxidation.
Figure 2:
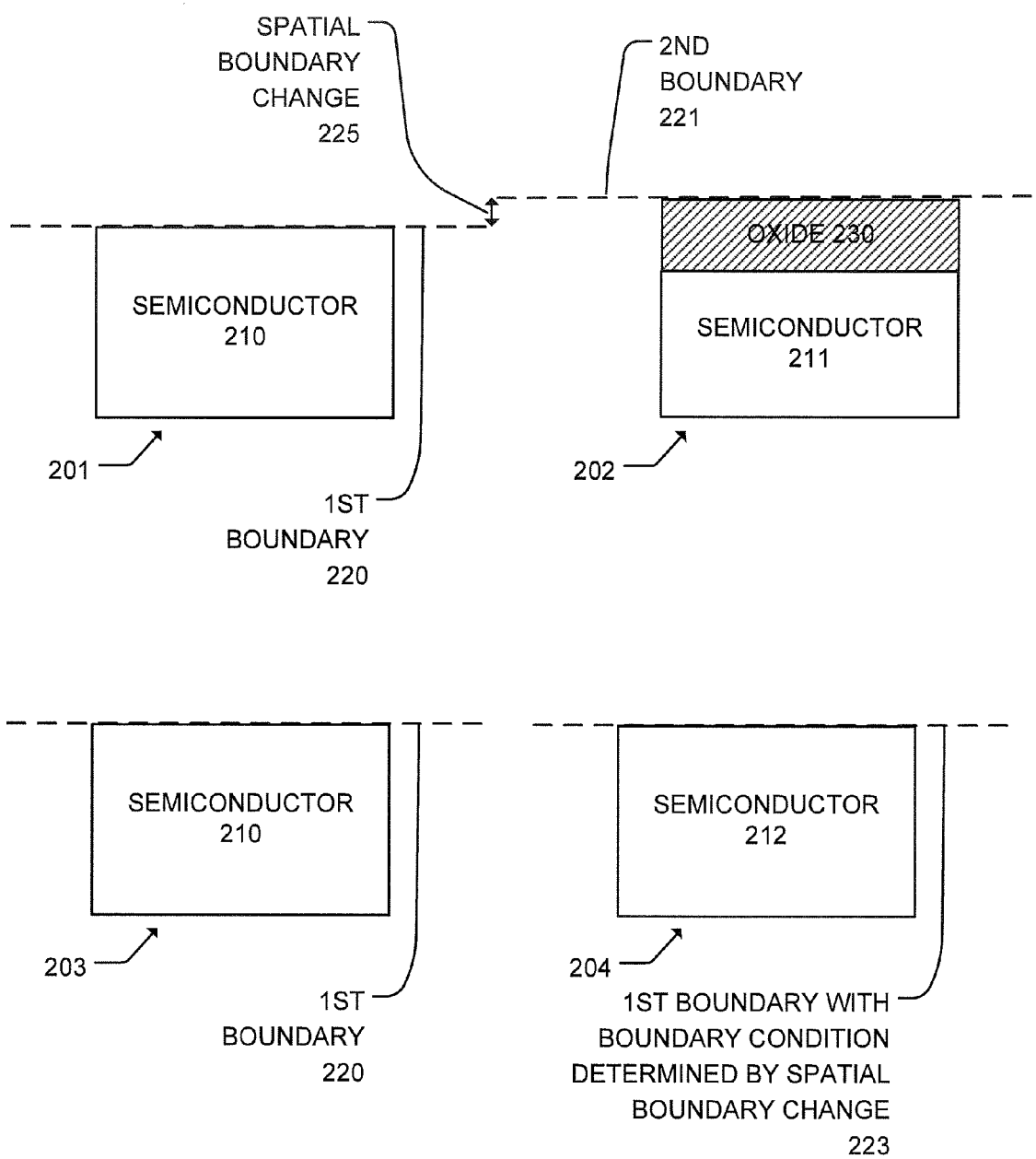
FIG. 2 shows an embodiment of the improved stress modeling, where oxide is grown on semiconductor.
Figure 3:
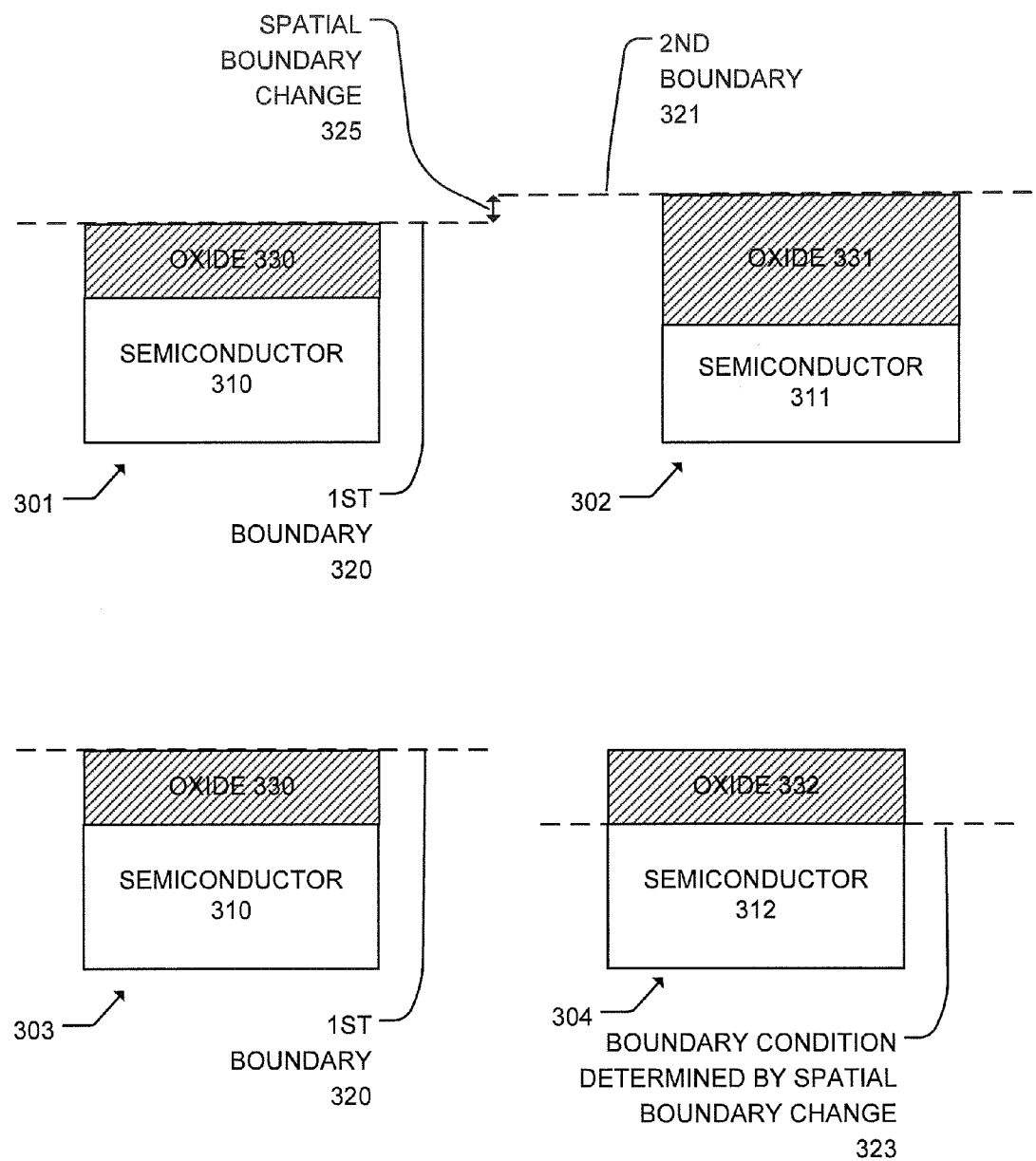
FIG. 3 shows an embodiment of the improved stress modeling, where additional oxide is grown on oxide.

FIG. 1 shows a transistor which is undergoing a material conversion in the form of semiconductor oxidation. A transistor 100 is formed in bulk semiconductor 112. Source and drain regions 110 are formed. Gate region 106 is formed. Shallow trench isolation regions 109 are formed through subsequent steps of oxidation, oxide deposition, and several additional reoxidation steps. Stress is generated at the steps of oxidation and reoxidation. Oxidation is shown at FIG. 2 and reoxidation is shown at FIG. 3. Thermal oxidation is done before creating the gate stack, and the transistor area is protected from oxidation by a nitride layer. Although there is no protection during reoxidation, the oxidations are thin and desirable for various reasons. However, the main stress source and the main target for the technology is the reoxidation. A shallow trench isolation region 109 shows ongoing reoxidation, where oxidants diffuse through the existing oxide. Shallower parts of the shallow trench isolation region have more diffusing oxidants, and deeper parts of the shallow trench isolation region have less diffusing oxidants. Accordingly, more oxidation occurs at shallower depths and less oxidation occurs as deeper depths. This variation with depth of the oxidation reaction is shown by the resulting stress, which varies with depth, indicating by the longer dotted arrows at shallower depths to indicate more stress, and the shorter dotted arrows at deeper depths to indicate less stress.

FIG. 2 shows an embodiment of the improved stress modeling, where oxide is grown on semiconductor. A modeled integrated circuit part 201 has a semiconductor material 210 which fills a first space having a first boundary 220. Following oxidation, the modeled integrated circuit part 201 becomes modeled integrated circuit part 202, in which the semiconductor material 211 and the oxide 230 together fill a second space, which has a second boundary 221. The spatial boundary change 225 is the distance between the first boundary 220 and the second boundary 221. The modeled integrated circuit part 202 shows that, as the oxide 230 is grown, part of the semiconductor 210 is consumed, and part the oxide 230 is an expansion. This expansion is the basis behind the spatial boundary change 225. This distinction between a consumed part of semiconductor, and an expansion part of the oxide, is explained in the paper by Grove et al. General Relationship for the Thermal Oxidation of Silicon, Journal of Applied Physics Volume 36, Number 12, December 1965, hereby incorporated by reference.

The material conversion from the modeled integrated circuit part 201 to the modeled integrated circuit part 202 is transformed as follows. Instead, the improved stress model shows the modeled integrated circuit part 203 undergoing a material conversion into the modeled integrated circuit part 204. Unlike the change of the modeled integrated circuit part 201 to the modeled integrated circuit part 202, the boundary is not changed to represent the expansion of the oxide. Accordingly, in the modeled integrated circuit part 203, the semiconductor 210 has the boundary 220; and after the material conversion, in the modeled integrated circuit part 204, the semiconductor 212 has the same boundary 223. However, the boundary 223 has a boundary condition determined by the spatial boundary change 225, in the form of a stress displacement.

FIG. 3 shows an embodiment of the improved stress modeling, where additional oxide is grown on oxide. Otherwise, the concepts are similar to FIG. 2.

A modeled integrated circuit part 301 has an oxide 330 on semiconductor material 310 which together fill a first space having a first boundary 320. Following oxidation, the modeled integrated circuit part 301 becomes modeled integrated circuit part 302, in which the larger oxide 331 on the semiconductor material 311 together fill a second space, which has a second boundary 321. The spatial boundary change 325 is the distance between the first boundary 320 and the second boundary 321. The modeled integrated circuit part 302 shows that, as the oxide 331 is grown, part of the semiconductor 310 is consumed, and part of the oxide 331 is an expansion. This expansion is the basis behind the spatial boundary change 325. Again, this distinction between a consumed part of semiconductor, and an expansion part of the oxide, is explained in the paper by Grove et al.

The material conversion from the modeled integrated circuit part 301 to the modeled integrated circuit part 302 is transformed as follows. Instead, the improved stress model shows the modeled integrated circuit part 303 undergoing a material conversion into the modeled integrated circuit part 304. Unlike the change of the modeled integrated circuit part 301 to the modeled integrated circuit part 302, the boundary is not changed to represent the expansion of the oxide. Accordingly, in the modeled integrated circuit part 303, the oxide 330 on the semiconductor 310 together have the boundary 320; and after the material conversion, in the modeled integrated circuit part 304, the oxide 332 on the semiconductor 312 has the same boundary 320. A boundary condition 323 at the boundary between the oxide 332 and the semiconductor 312, is determined by the spatial boundary change 325, in the form of a stress-induced displacement.

In other embodiments, the new material, such as an oxide, which undergoes a volume contraction is modeled.

Figure 4:
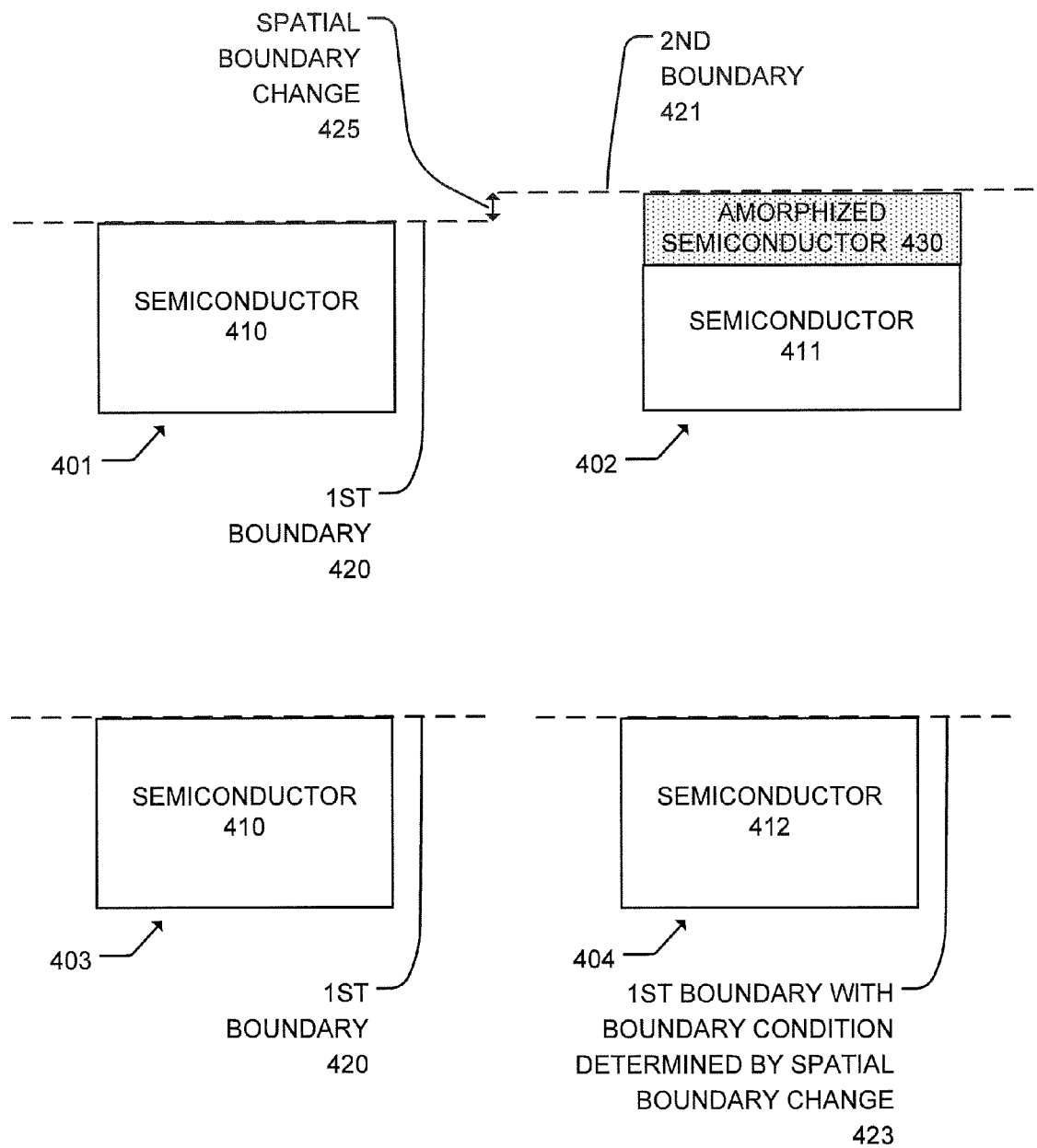
FIG. 4 shows an embodiment of the improved stress modeling, where semiconductor material is implanted.

FIG. 4 shows an embodiment of the improved stress modeling, where semiconductor material is implanted. Otherwise, the concepts are similar to FIG. 2. Amorphized semiconductor, e.g. silicon, is the subject of interest. Without amorphization, implantation does not create significant stress. Usually amorphization happens for implants where the ions being implanted are heavy and there is a large amount (dose) of such ions. Typical amorphizing implants are arsenic or phosphorus ions implanted at a dose larger than about $10^{14}$ ions/cm$^2$. Typical non-amorphizing implants are arsenic and phosphorus below $10^{14}$ ions/cm$^2$ or boron at any dose.

A modeled integrated circuit part 401 has a semiconductor material 410 which fills a first space having a first boundary 420. Following amorphizing implantation, the modeled integrated circuit part 401 becomes modeled integrated circuit part 402, in which the semiconductor material 411 and the amorphized implanted semiconductor 430 together fill a second space, which has a second boundary 421. The spatial boundary change 425 is the distance between the first boundary 420 and the second boundary 421. The modeled integrated circuit part 402 shows that, as the implanted semiconductor 430 is implanted, an expansion of the semiconductor 410 occurs. This expansion is the basis behind the spatial boundary change 445. The amorphization converts dense crystal semiconductor into less dense amorphous semiconductor. Typically, the density difference is of the order of 5% to 10%. The amorphization is always followed by epitaxial recrystallization, where the amorphous semiconductor is converted back into crystalline.

The material conversion from the modeled integrated circuit part 401 to the modeled integrated circuit part 402 is transformed as follows. Instead, the improved stress model shows the modeled integrated circuit part 403 undergoing a material conversion into the modeled integrated circuit part 404. Unlike the change of the modeled integrated circuit part 401 to the modeled integrated circuit part 402, the boundary is not changed to represent the expansion of the implanted semiconductor. Accordingly, in the modeled integrated circuit part 403, the semiconductor 410 has the boundary 420; and after the material conversion, in the modeled integrated circuit part 404, the semiconductor 412 has the same boundary 423. However, the boundary 423 has a boundary condition determined by the spatial boundary change 425, in the form of a stress displacement.

Figure 5:
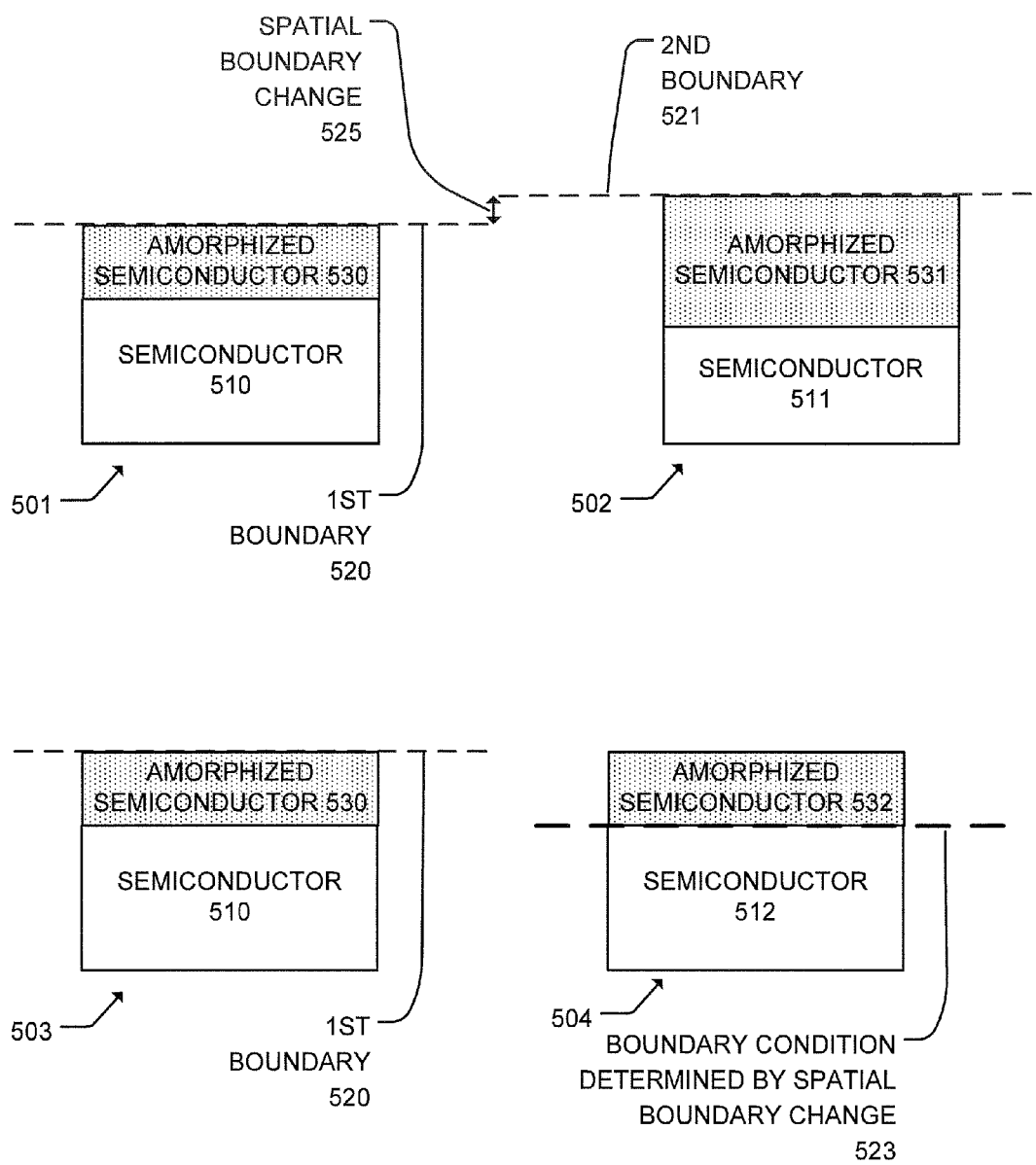
FIG. 5 shows an embodiment of the improved stress modeling, where already implanted semiconductor material is implanted.

FIG. 5 shows an embodiment of the improved stress modeling, where already amorphized semiconductor material is being further amorphized during ion implantation. Otherwise, the concepts are similar to FIG. 3.

A modeled integrated circuit part 501 has implanted semiconductor 530 on semiconductor material 510 which fills a first space having a first boundary 520. Following implantation, the modeled integrated circuit part 501 becomes modeled integrated circuit part 502, in which the semiconductor material 511 and the amorphized semiconductor 531 together fill a second space, which has a second boundary 521. The spatial boundary change 525 is the distance between the first boundary 520 and the second boundary 521. The modeled integrated circuit part 502 shows that, as the semiconductor 510 is implanted beyond amorphization threshold, an expansion of the semiconductor 530 occurs. This expansion is the basis behind the spatial boundary change 525

The material conversion from the modeled integrated circuit part 501 to the modeled integrated circuit part 502 is transformed as follows. Instead, the improved stress model shows the modeled integrated circuit part 503 undergoing a material conversion into the modeled integrated circuit part 504. Unlike the change of the modeled integrated circuit part 501 to the modeled integrated circuit part 502, the boundary is not changed to represent the expansion of the amorphized semiconductor. Accordingly, in the modeled integrated circuit part 503, the amorphized semiconductor 530 on the semiconductor 510 has the boundary 520; and after the material conversion, in the modeled integrated circuit part 504, the amorphized semiconductor 532 on the semiconductor 512 has the same boundary 520. However, at the interface between amorphized semiconductor 532 and the semiconductor 512 is a boundary condition 523 determined by the spatial boundary change 525, in the form of a stress displacement.

Figure 11:
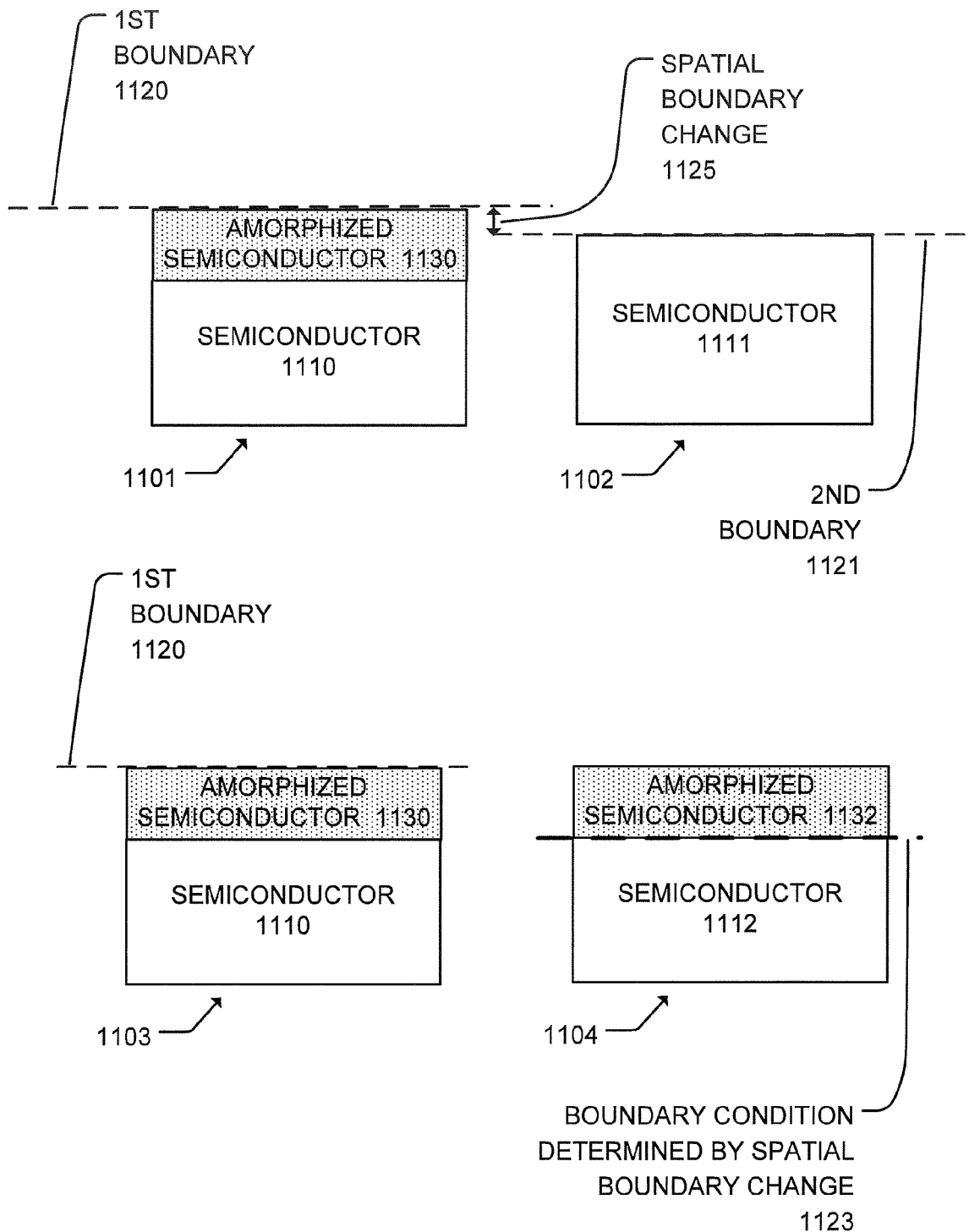
FIG. 11 shows an embodiment of the improved stress modeling, where amorphized semiconductor material recrystallizes.

FIG. 11 shows an embodiment of the improved stress modeling, where amorphized semiconductor material recrystallizes. Otherwise, the concepts are similar to FIG. 4.

A modeled integrated circuit part 1101 has amorphized semiconductor 1130 on semiconductor material 1110 which together fill a first space having a first boundary 1120. Following recrystallization, the modeled integrated circuit part 1101 becomes modeled integrated circuit part 1102, in which the semiconductor material 1111 fills a second space, which has a second boundary 1121. The spatial boundary change 1125 is the distance between the first boundary 1120 and the second boundary 1121. The modeled integrated circuit part 1102 shows that, as the amorphized semiconductor 1130 recrystallizes, a contraction of the amorphized semiconductor 1130 occurs. This contraction is the basis behind the spatial boundary change 1125. The recrystallization converts less dense amorphous semiconductor into dense crystal semiconductor.

The material conversion from the modeled integrated circuit part 1101 to the modeled integrated circuit part 1102 is transformed as follows. Instead, the improved stress model shows the modeled integrated circuit part 1103 undergoing a material conversion into the modeled integrated circuit part 1104. Unlike the change of the modeled integrated circuit part 1101 to the modeled integrated circuit part 1102, the boundary is not changed to represent the contraction of the amorphized semiconductor. Accordingly, in the modeled integrated circuit part 1103, the amorphized semiconductor 1130 on the semiconductor 1110 together have the boundary 1120; and after the material conversion, in the modeled integrated circuit part 1104, the amorphized semiconductor 1132 on the semiconductor 1112 has the same boundary 1120. However, the boundary between the amorphized semiconductor 1132 and the semiconductor 1112 has a boundary condition 1123 determined by the spatial boundary change 1125, in the form of a stress displacement.

Figure 6:
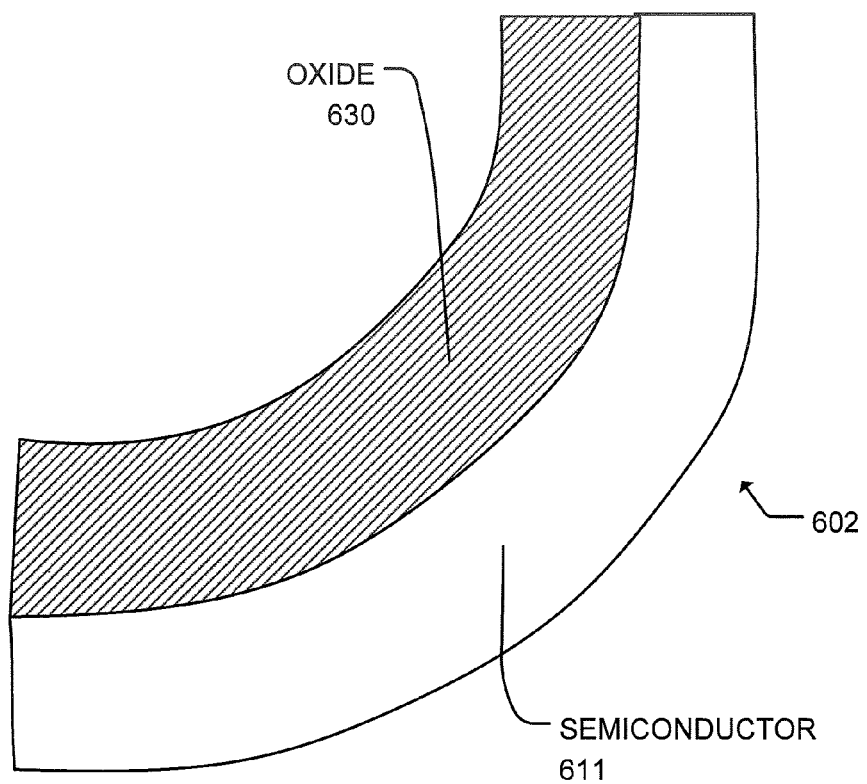
FIG. 6 shows an embodiment of the improved stress modeling, where the strain displacement boundary condition is calculated along the boundary of material undergoing material conversion.
Figure 6:
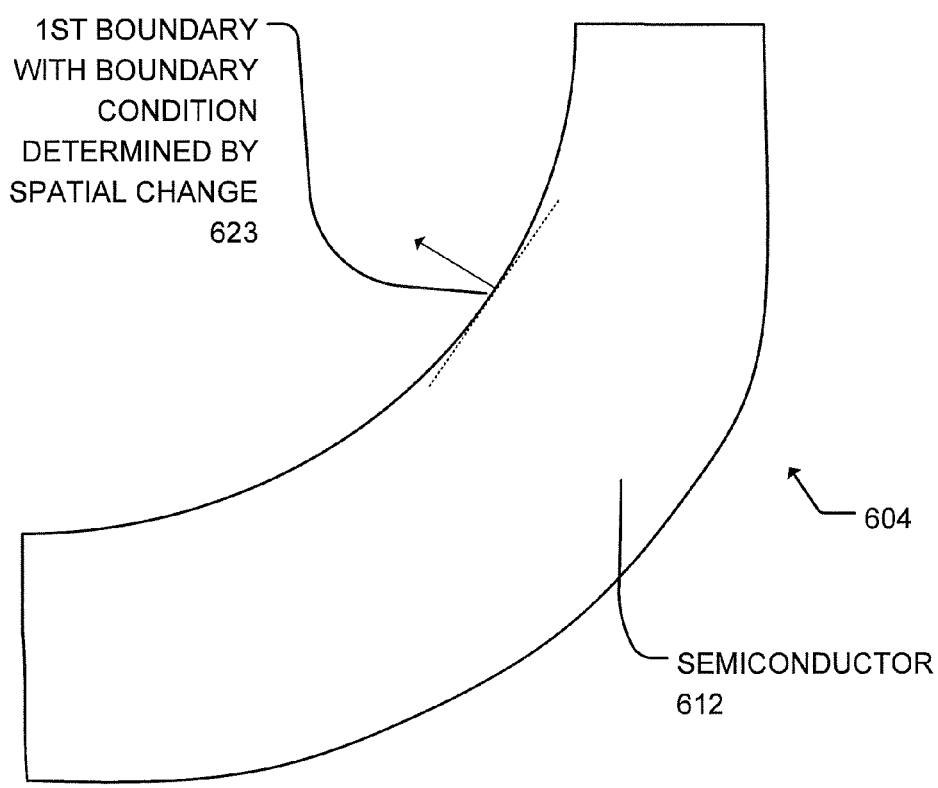

FIG. 6 shows an embodiment of the improved stress modeling, where the strain displacement boundary condition is calculated along the boundary of material undergoing material conversion. In modeled integrated circuit part 602, oxide 630 has been grown on semiconductor 611. In improved modeled integrated circuit part 604, the material conversion is converted into the pre-conversion semiconductor 612, and a boundary condition along the pre-growth boundary of the pre-conversion semiconductor 612. As shown above, the boundary condition is determined by the spatial change between the boundary of the pre-conversion semiconductor 612, and the boundary of the post-conversion oxide 630 on the semiconductor 611. The dotted line shows the local parallel line of an example point along the boundary of semiconductor 612, and the arrow perpendicular to the dotted local parallel line, has a length illustrative of the stress displacement, which has a magnitude determined by the spatial boundary change along the perpendicular direction indicated by the arrow.

Figure 7:
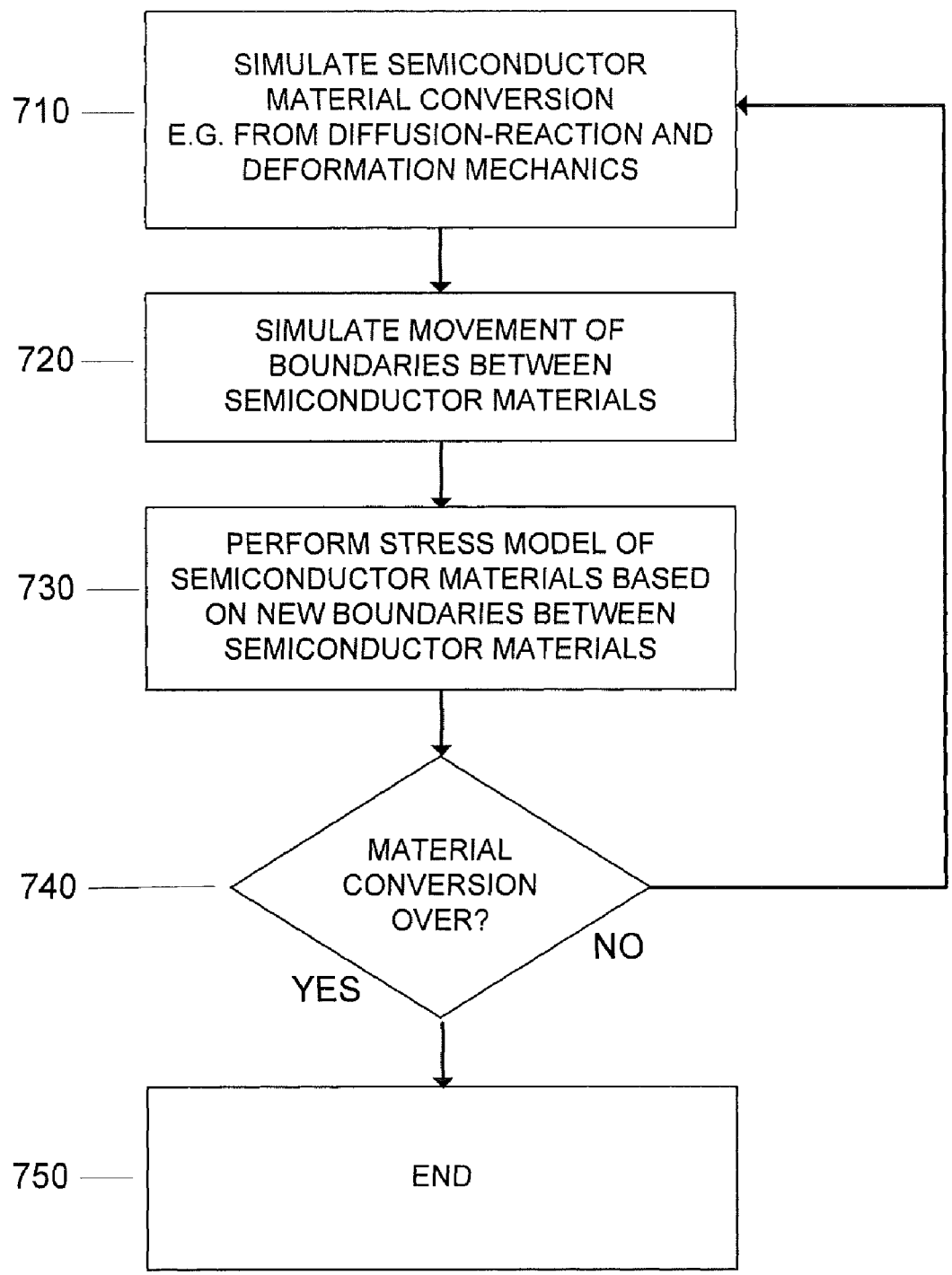
FIG. 7 shows a prior art flowchart which performs stress modeling by moving the boundary between materials of an integrated circuit participating in material conversion.

FIG. 7 shows a prior art flowchart which performs stress modeling by moving the boundary between materials of an integrated circuit participating in material conversion.

In 710, a computer performs the step of simulating a material conversion in an integrated circuit. For example, this simulation is performed from diffusion-reaction equations and deformation mechanics.

In 720, a computer performs the step of simulating the movement of boundaries between the materials, such as a semiconductor and oxide.

In 730, a computer performs the step of performing a stress modeling of semiconductor and oxide materials based on the new boundaries between the materials.

In 740, the process flow repeats, or not, depending on whether the incremental material conversion is over.

Figure 8:
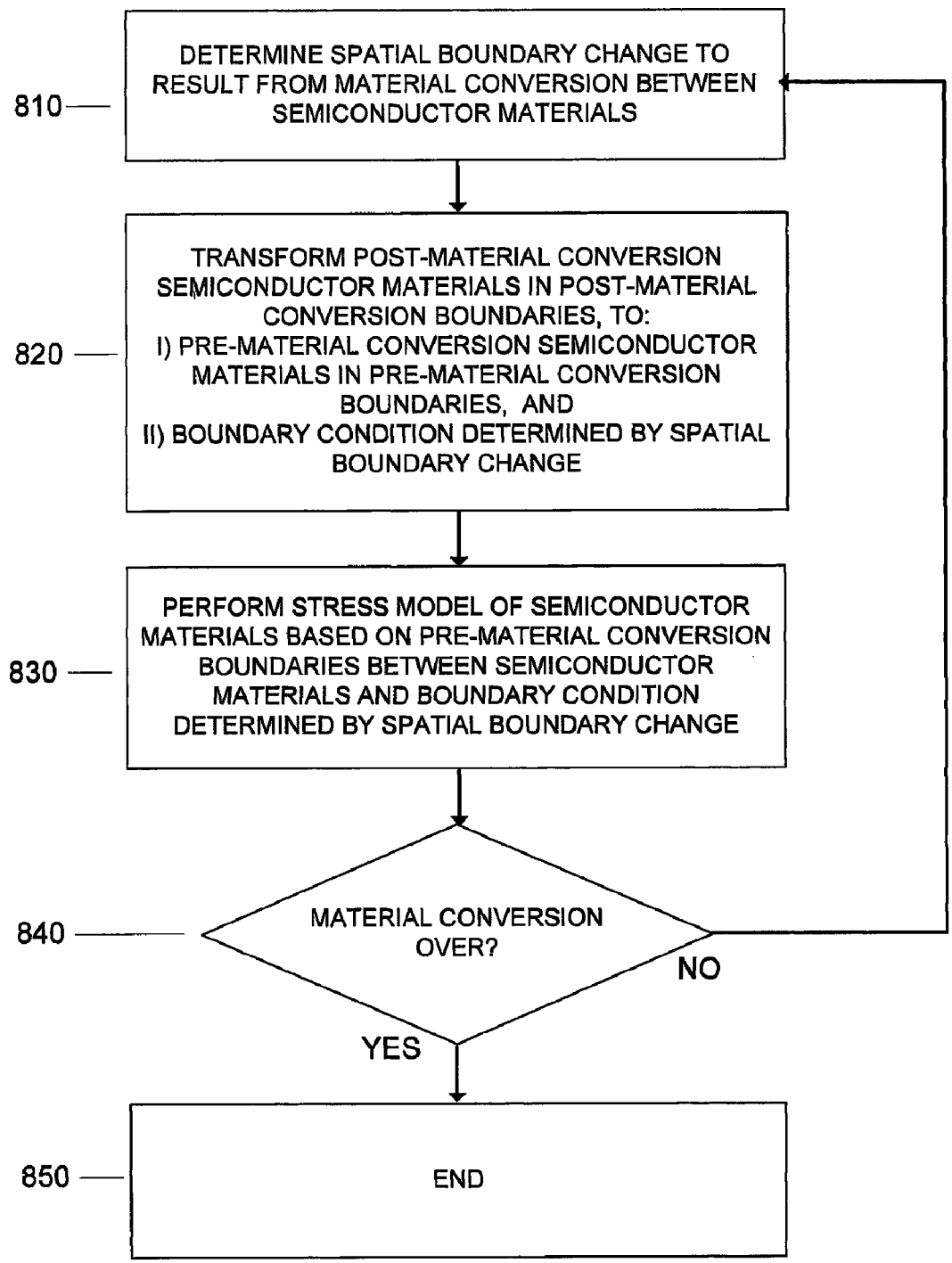
FIG. 8 shows a flowchart of an embodiment which performs stress modeling by maintaining the pre-conversion boundary between materials of an integrated circuit participating in material conversion, and using a boundary condition determined by the spatial boundary change associated with the material conversion.

FIG. 8 shows a flowchart of an embodiment which performs stress modeling by maintaining the pre-conversion boundary between materials of an integrated circuit participating in material conversion, and using a boundary condition determined by the spatial boundary change associated with the material conversion.

In 810, a computer determines the spatial boundary change to result from material conversion between semiconductor and oxide materials, such as a semiconductor and oxide. An example is shown by Moroz et al., "Modeling the impact of stress on silicon processes and devices", Materials Science in Semiconductor Processing 6 (2003) 27-36; hereby incorporated by reference.

In 820, a computer transforms the post-material conversion of semiconductor materials in post-material conversion boundaries, as follows. The material conversion is instead represented by: i) pre-material conversion semiconductor boundaries in pre-material conversion boundaries without changing geometry, and ii) a boundary condition determined by the spatial boundary change determined in step 810. The amount of displacement normal to the semiconductor boundary is determined at each point along the semiconductor boundary based on the spatial boundary change determined in step 810. This displacement is then used as a boundary condition for force rebalancing in the entire structure. The force rebalancing determines stress distribution in the oxide and the semiconductor. The boundary condition used in step 830 is similar to the boundary condition used in step 730, and therefore the resulting stress distributions are similar.

In 830, a computer performs the stress model of semiconductor materials based on pre-material conversion materials between semiconductor materials and the boundary condition determined by the spatial boundary change from step 820.

In 840, the process flow repeats, or not, depending on whether the incremental material conversion is over.

Figure 9:
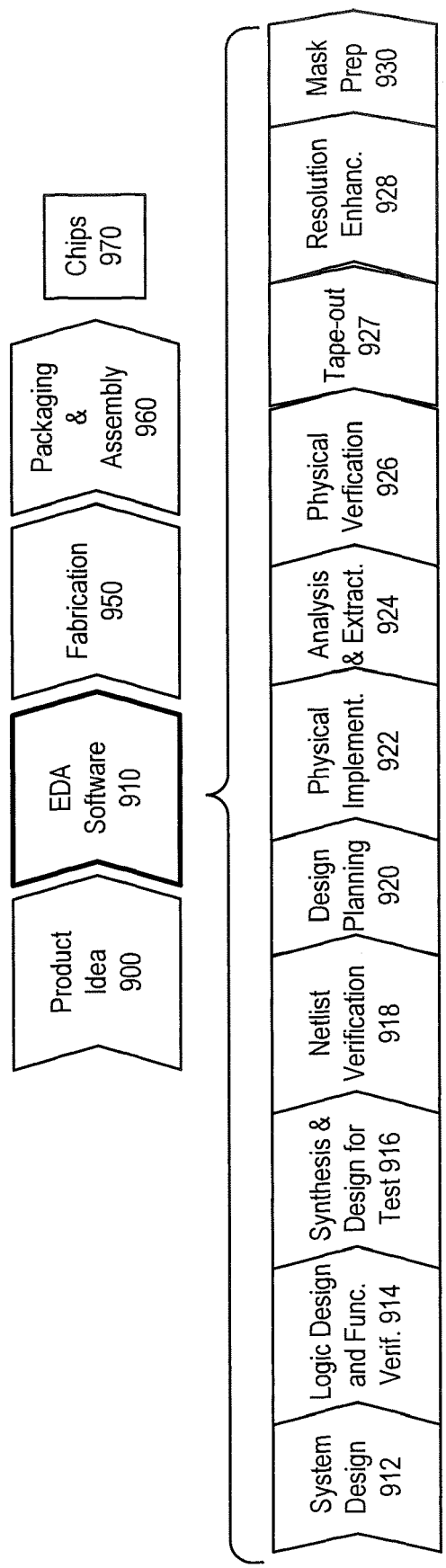
FIG. 9 shows a simplified representation of an illustrative integrated circuit design flow incorporating features of the technology.

FIG. 9 shows a simplified representation of an illustrative integrated circuit design flow incorporating features of the technology. At a high level, the process starts with the product idea (step 900) and is realized in an EDA (Electronic Design Automation) software design process (step 910). When the design is finalized, it can be taped-out (step 940). After tape out, the fabrication process (step 950) and packaging and assembly processes (step 960) occur resulting, ultimately, in finished integrated circuit chips (result 970).

The EDA software design process (step 910) is actually composed of a number of steps 912-930, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 910) will now be provided.

System design (step 912): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 914): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (step 916): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, Tetramax, and DesignWare® products.

Netlist verification (step 918): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 920): Here, an overall floor plan for the chip is constructed and analyzed for timing and top-level routing. Example EDA software products from Synopsys, Inc. that can be used at this step include Astro and IC Compiler products.

Physical implementation (step 922): The placement (positioning of circuit elements) and routing (connection of the same) occurs at this step. Example EDA software products from Synopsys, Inc. that can be used at this step include the Astro and IC Compiler products.

Analysis and extraction (step 924): At this step, the circuit function is verified at a transistor level, this in turn permits what-if refinement. Example EDA software products from Synopsys, Inc. that can be used at this step include AstroRail, PrimeRail, Primetime, and Star RC/XT products.

Physical verification (step 926): At this step various checking functions are performed to ensure correctness for: manufacturing, electrical issues, lithographic issues, and circuitry. Example EDA software products from Synopsys, Inc. that can be used at this step include the Hercules product.

Tape-out (step 927): This step provides the "tape out" data for production of masks for lithographic use to produce finished chips. Example EDA software products from Synopsys, Inc. that can be used at this step include the CATS(R) family of products.

Resolution enhancement (step 928): This step involves geometric manipulations of the layout to improve manufacturability of the design. Example EDA software products from Synopsys, Inc. that can be used at this step include Proteus, ProteusAF, and PSMGen products.

Mask data preparation (step 930): This step provides the "tape-out" data for production of masks for lithographic use to produce finished chips. Example EDA software products from Synopsys, Inc. that can be used at this step include the CATS(R) family of products.

The integrated circuit manufacturing flow includes a parallel flow, as follows:

(1) Develop individual process steps for manufacturing the integrated circuit. This can be modeled with the Synopsys tools "Sentaurus Process", "Sentaurus Topography", and "Sentaurus Lithography". The input information here is the process conditions like temperature, reactor ambient, implant energy, etc. The output information is the change in geometry or doping profiles or stress distribution.

(2) Integrate the individual process steps into the complete process flow. This can be modeled with the Synopsys tool "Sentaurus Process". The input information here is the collection of the process steps in the appropriate sequence. The output is the geometry, the doping profiles, and the stress distribution for the transistors and the space in between the transistors.

(3) Analyze performance of the transistor manufactured with this process flow. This can be done with the Synopsys tool "Sentaurus Device". The input information here is the output of step (3) and the biases applied to transistor terminals. The output information is the currents and capacitances for each bias combination.

(4) If necessary, modify the process steps and the process flow to achieve the desired transistor performance. This can be done iteratively by using the Synopsys tools mentioned above.

Once the process flow is ready, it can be used for manufacturing multiple circuit designs coming from different fabless companies. The EDA flow 912-930 will be used by such fabless companies. The parallel flow described here is used at a foundry to develop a process flow that can be used to manufacture designs coming from their fabless customers. A combination of the process flow and the masks 930 are used to manufacture any particular circuit. If the integrated circuit is manufactured at an IDM (integrated device manufacturer) company instead of the combination of a fables company and a foundry, then both parallel flows described above are done at the same IDM company.

There is also a bridge between these tools and the 912-930 EDA tools. The bridge is a Synopsys tool "Seismos" that applies compact proximity models for particular circuit design and layout to obtain netlist with instance parameters for each individual transistor in the circuit as a function of its neighborhood and stress, including material conversion stress. This netlist is used in the analysis step 924.

Figure 10:
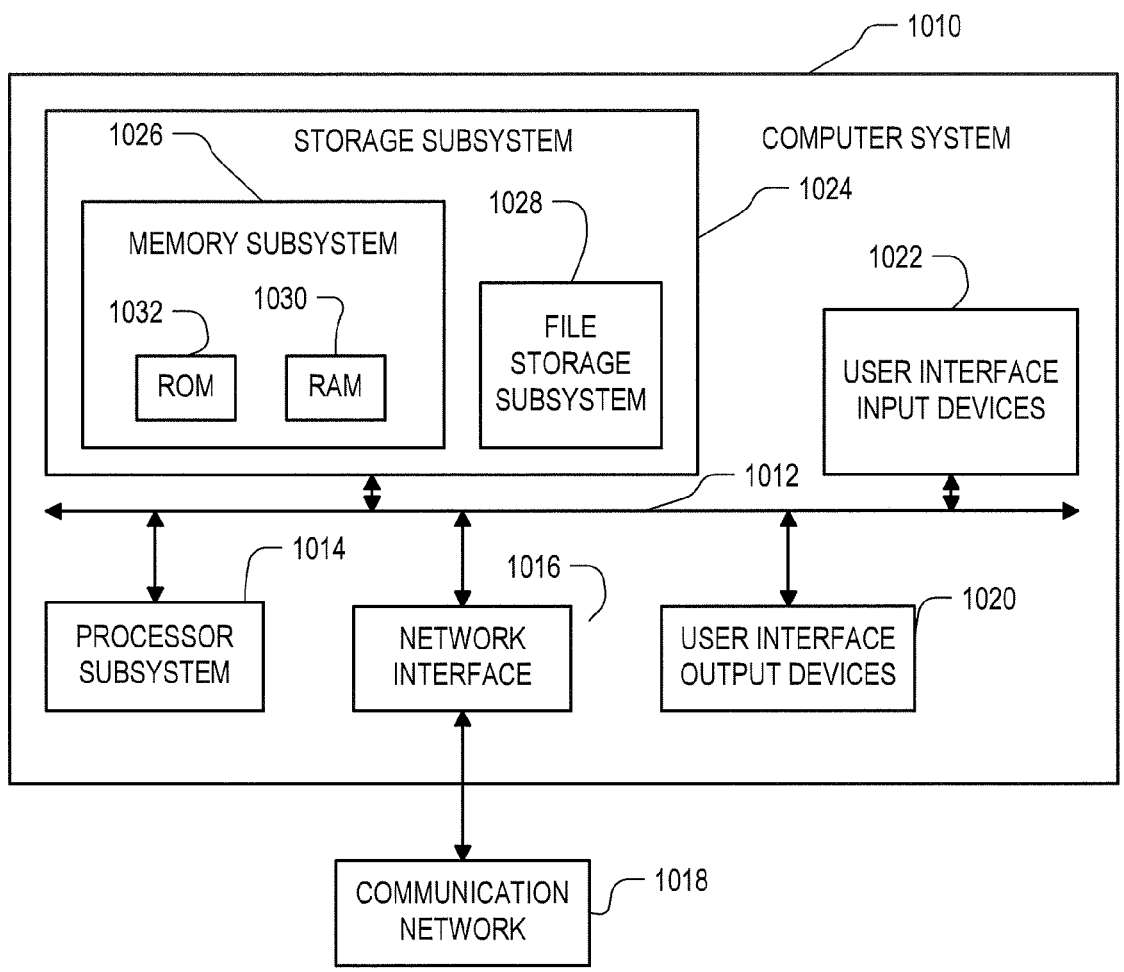
FIG. 10 is a simplified block diagram of a computer system that can be used to implement software incorporating aspects of the technology.

FIG. 10 is a simplified block diagram of a computer system that can be used to implement software incorporating aspects of the technology. Computer system 1014 typically includes a processor subsystem 1014 which communicates with a number of peripheral devices via bus subsystem 1012. These peripheral devices may include a storage subsystem 1024, comprising a memory subsystem 1026 and a file storage subsystem 1028, user interface input devices 1022, user interface output devices 1020, and a network interface subsystem 1016. The input and output devices allow user interaction with computer system 1014. Network interface subsystem 1016 provides an interface to outside networks, including an interface to communication network 1018, and is coupled via communication network 1018 to corresponding interface devices in other computer systems. Communication network 1018 may comprise many interconnected computer systems and communication links. These communication links may be wireline links, optical links, wireless links, or any other mechanisms for communication of information. While in one embodiment, communication network 1018 is the Internet, in other embodiments, communication network 1018 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 1022 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 1014 or onto computer network 1018.

User interface output devices 1020 may include a display subsystem, a printer, a fax machine, or non visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 1014 to the user or to another machine or computer system.

Storage subsystem 1024 stores the basic programming and data constructs that provide the functionality of certain aspects of the present invention. For example, the various modules implementing the functionality of a circuit simulator and computer-implemented steps in the prior figures may be stored in storage subsystem 1024. These software modules are generally executed by processor subsystem 1014. The data constructs stored in the storage subsystem 1024 also can include any technology files, macrocell libraries, layout files, and other databases mentioned herein. Note that in some embodiments, one or more of these can be stored elsewhere but accessibly to the computer system 1014, for example via the communication network 1018.

Memory subsystem 1026 typically includes a number of memories including a main random access memory (RAM) 1030 for storage of instructions and data during program execution and a read only memory (ROM) 1032 in which fixed instructions are stored. File storage subsystem 1028 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs (or may have been communicated to the computer system 1014 via the communication network 1018), and may be stored by file storage subsystem 1028. The host memory 1026 contains, among other things, computer instructions which, when executed by the processor subsystem 1014, cause the computer system to operate or perform functions as described herein. As used herein, processes and software that are said to run in or on "the host" or "the computer", execute on the processor subsystem 1014 in response to computer instructions and data in the host memory subsystem 1026 including any other local or remote storage for such instructions and data.

Bus subsystem 1012 provides a mechanism for letting the various components and subsystems of computer system 1014 communicate with each other as intended. Although bus subsystem 1012 is shown schematically as a single bus, alternative embodiments of the bus subsystem may use multiple busses.

Computer system 1014 itself can be of varying types including a personal computer, a portable computer, a workstation, a computer terminal, a network computer, a television, a mainframe, or any other data processing system or user device. Due to the ever changing nature of computers and networks, the description of computer system 1014 depicted in FIG. 10 is intended only as a specific example for purposes of illustrating the preferred embodiments of the present invention. Many other configurations of computer system 1014 are possible having more or less components than the computer system depicted in FIG. 10.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of modeling an integrated circuit undergoing manufacture, the method for use by a computer system having a processor and memory, the method comprising:
the computer system performing a stress model of the integrated circuit undergoing manufacture, the stress model transforming a representation of a material conversion of a first material in the integrated circuit to a second material in the integrated circuit, wherein prior to the material conversion the first material occupies a first space having a first boundary, wherein after the material conversion the first material and the second material together occupy a second space having a second boundary, wherein the first space and the second space are different, and the stress model performed by the computer system transforms the representation of the material conversion of the first material to the second material into: i) the first material occupying the first space having the first boundary, and ii) a strain displacement condition of the first material, the strain displacement condition being determined by a spatial change from the first boundary to the second boundary.

2. The method of claim 1, further comprising:
the computer system transforming a circuit design of the integrated circuit into a definition of a lithographic mask to manufacture the integrated circuit, including said performing the stress model.

3. The method of claim 1, further comprising:
the computer system simulating defect formation of devices in the integrated circuit such that the defect formation of the devices vary with the stress model transforming the representation of the material conversion.

4. The method of claim 1, further comprising:
the computer system simulating electrical performance of devices in the integrated circuit such that the electrical performances of the devices simulated by the computer system vary with the stress model transforming the representation of the material conversion.

5. The method of claim 1, further comprising:
the computer system simulating manufacturing yield of devices in the integrated circuit such that the manufacturing yields of the devices simulated by the computer system vary with the stress model transforming the representation of the material conversion.

6. The method of claim 1, wherein the first material is silicon, the second material is silicon oxide, and the material conversion of the material is growth of silicon oxide on the silicon.

7. The method of claim 1, wherein the first material is semiconductor, the second material is oxide, and the material conversion of the material is growth of the oxide on the semiconductor.

8. The method of claim 1, wherein the first material is silicon oxide on silicon, the second material is additional silicon oxide, and the material conversion of the material is growth of the additional silicon oxide on the silicon oxide on the silicon.

9. The method of claim 1, wherein the first material is oxide on semiconductor, the second material is additional oxide, and the material conversion of the material is growth of the additional oxide on the oxide on the semiconductor.

10. The method of claim 1, wherein the first material is semiconductor, the second material is amorphized semiconductor, and the material conversion of the material is amorphization of the semiconductor.

11. The method of claim 1, wherein the first material is semiconductor, the second material is silicide, and the material conversion of the material is silicidation.

12. The method of claim 1, wherein the first material is amorphized semicondcuctor, the second material is recrystallized semiconductor, and the material conversion of the material is recrystallization.

13. The method of claim 1, wherein the strain displacement condition is at the first boundary of the first space.

14. The method of claim 1, wherein the strain displacement condition is at a material boundary separating the first material and the second material.

15. The method of claim 1, wherein the strain displacement condition is determined by the spatial change from the first boundary to the second boundary, in that the strain displacement condition is determined by distance from the first boundary to the second boundary.

16. The method of claim 1, wherein the strain displacement condition is determined by the spatial change from the first boundary to the second boundary, in that the strain displacement condition is determined by distance from the first boundary to the second boundary,
wherein the distance from the first boundary to the second boundary, is in a direction perpendicular to a location of the boundary of the first space.

17. The method of claim 1, wherein the strain displacement condition is determined by the spatial change from the first boundary to the second boundary, in that the strain displacement condition along the first boundary is determined along the first boundary by distances from locations along the first boundary to the second boundary.

18. The method of claim 1, wherein the strain displacement condition is determined by the spatial change from the first boundary to the second boundary, in that the strain displacement condition along the first boundary is determined along the first boundary by distances from locations along the first boundary to the second boundary,
wherein the distances from the locations along the first boundary to the second boundary, is in directions perpendicular to the first boundary.

19. The method of claim 1, wherein the stress model is three-dimensional.

20. The method of claim 1, wherein the stress model is two-dimensional.

21. A non-transitory computer readable medium storing computer instructions to perform a method of modeling an integrated circuit undergoing manufacture, the method for use by a computer system having a processor and memory, the computer instructions comprising:
computer instructions executable by the computer system performing a stress model of the integrated circuit undergoing manufacture, the stress model transforming a representation of a material conversion of a first material in the integrated circuit to a second material in the integrated circuit, wherein prior to the material conversion the first material occupies a first space having a first boundary, wherein after the material conversion the first material and the second material together occupy a second space having a second boundary, wherein the first space and the second space are different, and the stress model performed by the computer system transforms the representation of the material conversion of the first material to the second material into: i) the first material occupying the first space having the first boundary, and ii) a strain displacement condition of the first material at the first boundary of the first space, the strain displacement condition being determined by a spatial change from the first boundary to the second boundary.

22. A computer system modeling an integrated circuit undergoing manufacture, comprising:

a processor and memory, performing a stress model of the integrated circuit undergoing manufacture, the stress model transforming a representation of a material conversion of a first material in the integrated circuit to a second material in the integrated circuit, wherein prior to the material conversion the first material occupies a first space having a first boundary, wherein after the material conversion the first material and the second material together occupy a second space having a second boundary, wherein the first space and the second space are different, and the stress model performed by the computer system transforms the representation of the material conversion of the first material to the second material into: i) the first material occupying the first space having the first boundary, and ii) a strain displacement condition of the first material at the first boundary of the first space, the strain displacement condition being determined by a spatial change from the first boundary to the second boundary.

* * * * *